US012591180B2

(12) United States Patent
Sakata et al.

(10) Patent No.: US 12,591,180 B2
(45) Date of Patent: Mar. 31, 2026

(54) SUBSTRATE PROCESSING APPARATUS AND SUBSTRATE PROCESSING METHOD

(71) Applicant: Tokyo Electron Limited, Tokyo (JP)

(72) Inventors: Yoji Sakata, Kumamoto (JP); Shingo Katsuki, Kumamoto (JP); Ryohei Fujise, Kumamoto (JP); Kenichirou Matsuyama, Kumamoto (JP); Shinsuke Takaki, Kumamoto (JP); Hiroyuki Iwaki, Tokyo (JP); Hiroki Tadatomo, Tokyo (JP); Tomoya Onitsuka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 137 days.

(21) Appl. No.: 18/412,739

(22) Filed: Jan. 15, 2024

(65) Prior Publication Data

US 2024/0248417 A1 Jul. 25, 2024

(30) Foreign Application Priority Data

Jan. 23, 2023 (JP) ................................. 2023-007903

(51) Int. Cl.
*G03F 7/00* (2006.01)
(52) U.S. Cl.
CPC ...... *G03F 7/70866* (2013.01); *G03F 7/70716* (2013.01); *G03F 7/7075* (2013.01); *G03F 7/70808* (2013.01)
(58) Field of Classification Search
CPC ............. G03F 7/70866; G03F 7/70716; G03F 7/7075; G03F 7/70808; G03F 7/0042;

H01L 21/67703; H01L 21/308; H01L 21/67017; H01L 21/67069; H01L 21/67225; H01L 21/67098; H01L 21/67196; H01L 21/67769
See application file for complete search history.

(56) References Cited

U.S. PATENT DOCUMENTS

| | | | |
|---|---|---|---|
| 6,863,733 B1 * | 3/2005 | Tanabe .............. | H01L 21/02532 |
| | | | 118/715 |
| 8,366,872 B2 * | 2/2013 | Tsutsumi ............ | G03F 7/70916 |
| | | | 216/87 |
| 10,025,190 B2 * | 7/2018 | Nagahara .............. | G03F 7/2004 |
| 11,158,490 B2 * | 10/2021 | Matsuo ............. | H01J 37/32449 |
| 2004/0187786 A1 * | 9/2004 | Tanaka .............. | H01L 21/67017 |
| | | | 118/719 |

FOREIGN PATENT DOCUMENTS

JP        2010-219434 A        9/2010

* cited by examiner

*Primary Examiner* — Hung V Nguyen
(74) *Attorney, Agent, or Firm* — Nath, Goldberg & Meyer; Jerald L. Meyer; Tanya E. Harkins

(57) ABSTRACT

A substrate processing apparatus includes a first transfer path that is a transfer path for a substrate after MOR film formation and before exposure, and a second transfer path that is a transfer path for the substrate after exposure; and one or a plurality of nitrogen atmosphere placement stages provided on at least one of the first transfer path and the second transfer path and configured to place the substrate in an environment with a nitrogen concentration of an atmosphere set higher than that of air.

12 Claims, 16 Drawing Sheets

| | OPEN-A | OPEN-B | FULL CLOSE |
|---|---|---|---|
| I | Down | UP | Down |
| II | Down | UP | UP |
| III | Down | Down | UP |
| IV | Down | Down | UP |

FIG. 9A

OPEN-A 1,2

OPEN-B 3,4

520

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2023-007903, filed on Jan. 23, 2023, the entire contents of which are incorporated herein by reference.

TECHNICAL FIELD

The present disclosure relates to a substrate processing apparatus and a substrate processing method.

BACKGROUND

Patent Document 1 discloses a substrate processing apparatus that performs photolithography processes such as coating a wafer with a resist to form a resist film and developing a completely exposed resist film through the supply of a developer.

PRIOR ART DOCUMENTS

Patent Documents

Patent Document 1: Japanese laid-open publication No. 2010-219434

SUMMARY

According to one embodiment of the present disclosure, there is provided a substrate processing apparatus includes a first transfer path that is a transfer path for a substrate after MOR film formation and before exposure, and a second transfer path that is a transfer path for the substrate after exposure; and one or a plurality of nitrogen atmosphere placement stages provided on at least one of the first transfer path and the second transfer path and configured to place the substrate in an environment with a nitrogen concentration of an atmosphere set higher than that of air.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3A is a front view schematically illustrating an example of the layout of a delivery device of a fifth block, and FIG. 3B is a front view schematically illustrating another example of the layout of the delivery device of the fifth block.

FIG. 9A is a side view schematically illustrating the shutter state in the "OPEN-A" mode, and FIG. 9B is a side view schematically illustrating the shutter state in the "OPEN-B" mode.

DETAILED DESCRIPTION

Figure 1:
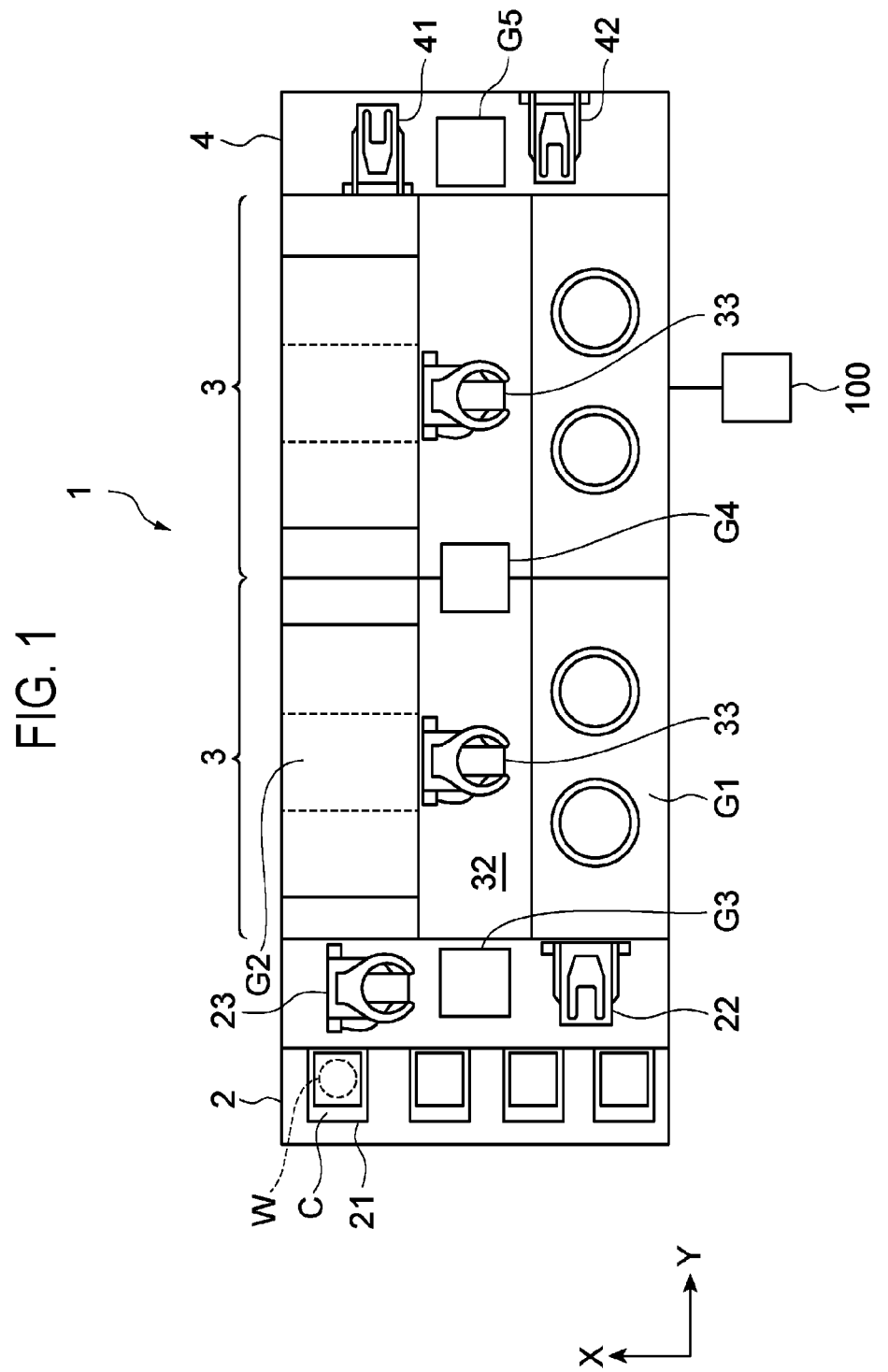
FIG. 1 is a plan view schematically illustrating the outline of a configuration of a wafer processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, a wafer processing system as a substrate processing apparatus according to the present embodiment will be described with reference to the drawings. In addition, in this specification, elements having substantially the same functional configuration will be denoted by the same reference numerals, and redundant descriptions thereof will be omitted.

<Wafer Processing System>

Figure 2:
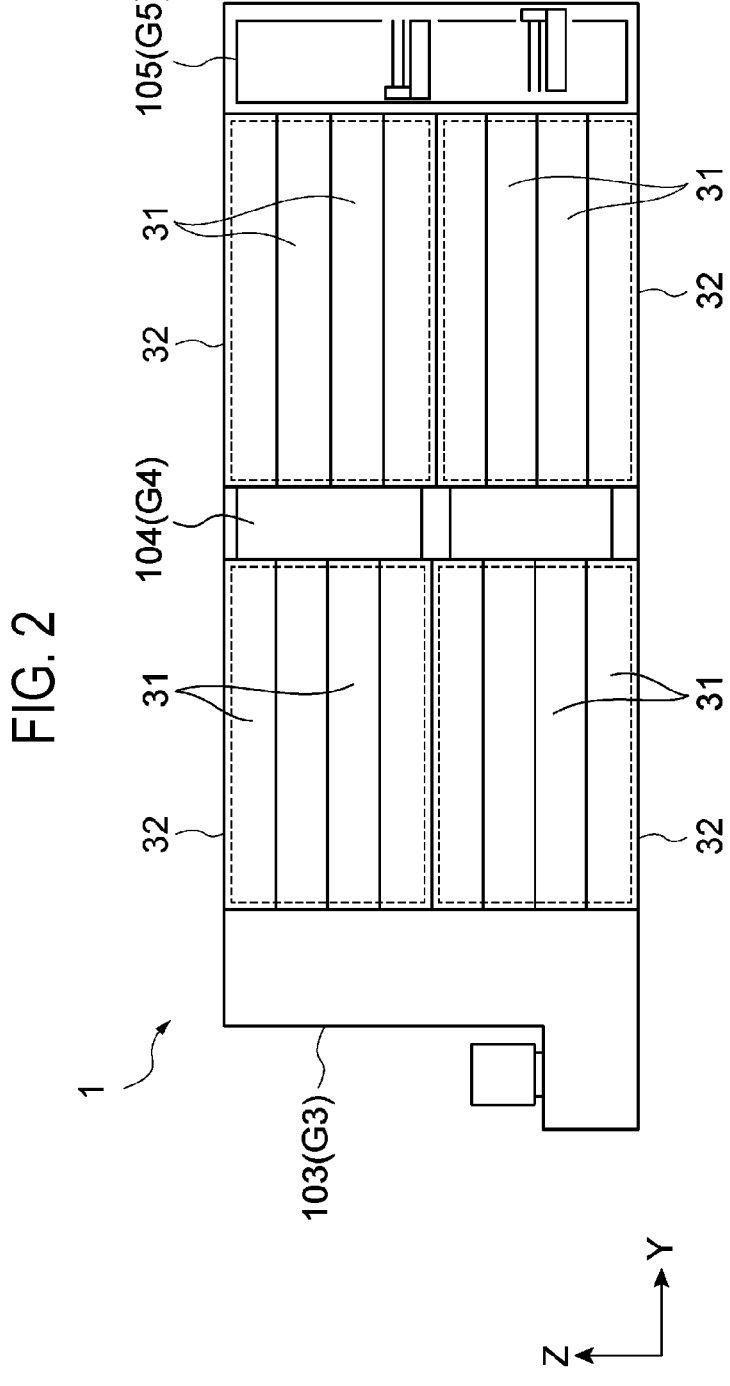
FIG. 2 is a front view schematically illustrating the outline of the configuration of the wafer processing system.

First, a configuration of a wafer processing system according to the present embodiment will be described. FIGS. 1 and 2 are a plan view and a front view, respectively, schematically illustrating the outline of a configuration of a wafer processing system 1. In the present embodiment, a case where the wafer processing system 1 is a photolithography processing system that performs a resist film forming process and a developing process on a wafer W will be described by way of example.

As illustrated in FIG. 1, the wafer processing system 1 includes a cassette station 2 where a cassette C accommodating a plurality of wafers W is loaded and unloaded and a processing station 3 having a plurality of various processing apparatuses to perform predetermined processes on the wafer W. The wafer processing system 1 is then configured in such a way that the cassette station 2 and the processing station 3 are integrally connected with an interface station 4 that delivers the wafer W to and from an exposure apparatus (not illustrated) adjacent thereto on the opposite side from the processing station 3. In addition, as illustrated in FIG. 1, two processing stations 3 are provided between the cassette station 2 and the interface station 4, but only one processing station 3 may be provided, or three or more processing stations 3 may be provided.

The cassette station 2 is provided with a plurality of cassette placing tables 21 and wafer transfer devices 22 and 23. In the cassette station 2, the wafer is transferred between the cassette C placed on the cassette placing table 21 and the processing station 3 by the wafer transfer device 22 or the wafer transfer device 23. Therefore, the wafer transfer devices 22 and 23 may have drive mechanisms for respective directions such as the X-direction, Y-direction, vertical direction, and rotational direction around the vertical axis (0 direction) as needed, or may have a drive mechanism for all directions. At least one of the wafer transfer devices 22 and 23 is capable of delivering the wafer W to and from the cassette C and is also capable of delivering the wafer to and from the processing station 3. In addition, the delivery operation of the wafer W to and from the processing station 3 involves, for example, delivering the wafer to and from a third block G3 having a delivery device accessible by a wafer transfer device 33 in the processing station 3 to be described later. The delivery device in the third block G3 may be, for example, a tower-shaped delivery device 103 (see FIG. 2) in which a plurality of accommodation spaces are formed vertically at multiple levels.

In addition, an inspection device (not illustrated) for inspecting the wafer W may be provided at a position accessible by at least one of the wafer transfer devices 22 and 23.

The processing station 3 is provided with a plurality of blocks such as a first block G1, a second block G2, and a fourth block G4. Further, as illustrated in FIG. 2, a plurality of layers 31 including the first block G1 and the second block G2 are stacked in the vertical direction. For example, the first block G1 is provided on the front side of the processing station 3 (the X-direction negative side in FIG. 1), and the second block G2 is provided on the rear side of the processing station 3 (the X-direction positive side in FIG. 1). The fourth block G4 is provided on the side of the processing station 3 toward the interface station 4 (the Y-direction positive side in FIG. 1) or at a connection portion with the other adjacent processing station 3. The fourth block G4 may have a delivery device. The delivery device in the fourth block G4 may be, for example, a tower-shaped delivery device 104 (see FIG. 2) in which a plurality of accommodation spaces are formed vertically at multiple levels. Further, the above-described third block G3 may be provided in the processing station 3.

In the first block G1, a plurality of liquid processing apparatuses such as a film forming apparatus for patterning and a developing apparatus are arranged, although all of which are not illustrated. The film forming apparatus for patterning may include, for example, an anti-reflective film forming apparatus as well as a resist film forming apparatus.

For example, a plurality of processing apparatuses are arranged side by side in the horizontal direction. In addition, the number, arrangement, and type of these processing apparatuses may be arbitrarily selected.

The film forming apparatus for patterning and developing apparatus perform, for example, the supply of a predetermined processing liquid onto the wafer W, or the supply of a predetermined gas. In this way, the film forming apparatus for patterning performs processes such as the formation of a resist film used as a mask when forming a pattern on an underlying film and the formation of an anti-reflective film and others for facilitating a light irradiation process such as an exposure process. Further, on the other hand, the developing apparatus gives an uneven shape to the mask by removing a portion of the exposed resist film.

For example, in the second block G2, thermal-processing units (not illustrated) that perform thermal processing such as heating and cooling of the wafer W are arranged side by side in the vertical and horizontal directions. Further, in the second block G2, a hydrophobization apparatus that performs hydrophobization to increase the adhesion between a resist liquid and the wafer W and a peripheral exposure apparatus that exposes the outer periphery of the wafer W are arranged side by side in the vertical direction (Z-direction in FIG. 2) and the horizontal direction, although all of which are not illustrated. The number and arrangement of these thermal-processing units, hydrophobization apparatus, and peripheral exposure apparatus may also be arbitrarily selected.

A wafer transfer area 32 is formed in a sandwiched area between the first block G1 and the second block G2 in a plan view as illustrated in FIG. 1. For example, the wafer transfer device 33 is located in the wafer transfer area 32.

The wafer transfer device 33 includes, for example, a transfer arm that is movable in the Y-direction, the front-and-rear direction, the 0 direction, and the vertical direction. The wafer transfer device 33 may move in the wafer transfer area 32 to transfer the wafer W to predetermined devices in the first block G1, the second block G2, the third block G3, and the fourth block G4 around thereof. When a plurality of processing stations 3 are provided as illustrated in FIG. 1, the wafer transfer device 33 provided in the processing station 3 located on the side toward the interface station 4 may transfer the wafer W to the first block G1, the second block G2, and the third block G3. Further, the wafer transfer device 33 may transfer the wafer W to a predetermined device in a fifth block G5 to be described later.

A plurality of wafer transfer devices 33 may be arranged vertically. One wafer transfer device 33 may transfer the wafer W to predetermined devices located at the heights of the upper side layers 31, among the plurality of vertically stacked layers 31 (see FIG. 2). Another wafer transfer device 33 may transfer the wafer W to predetermined devices located at the heights of the layers 31 below the upper side layers 31. To enable the transfer of the wafer W in this manner, a plurality of wafer transfer areas 32 (see FIG. 2) are provided. In addition, the number of wafer transfer devices 33 and the number of layers 31 corresponding to one wafer transfer device 33 may be arbitrarily selected. For example, the wafer transfer device 33 may be provided for each layer 31.

Further, a shuttle transfer device (not illustrated) may be provided in the wafer transfer area 32, the first block G1, or the second block G2. The shuttle transfer device linearly transfers the wafer W between a space adjacent to one side of the processing station 3 and another space adjacent to the opposite side.

The interface station 4 is provided with the fifth block G5 having a plurality of delivery devices and wafer transfer devices 41 and 42. The interface station 4 transfers the wafer W using the wafer transfer device 41 or the wafer transfer device 42 between an exposure apparatus and the fifth block G5 to which the wafer W is delivered by the wafer transfer device 33. Therefore, the wafer transfer devices 41 and 42 may have drive mechanisms for respective directions such as the X-direction, Y-direction, vertical direction, and rotational direction around the vertical axis (0 direction) as needed, or may have a drive mechanism for all directions. At least one of the wafer transfer devices 41 and 42 may support the wafer W and transfer the wafer W between the exposure apparatus and the delivery device in the fifth block G5. The delivery device in the fifth block G5 may be, for example, a tower-shaped delivery device (tower) 105 (see FIG. 2) in which a plurality of accommodation spaces are formed vertically at multiple levels.

A cleaning apparatus for cleaning the surface of the wafer W and the aforementioned peripheral exposure apparatus may be provided in the interface station 4 at positions accessible by at least one of the wafer transfer devices 41 and 42.

The wafer processing system 1 described above is provided with a controller 100. The controller 100 is, for example, a computer and includes a program storage (not illustrated). The program storage stores a program that controls the processing of the wafer in the wafer processing system 1. Further, the program storage also stores a program for controlling the operation of drive systems for various processing apparatuses and transfer devices described above to realize the processing of the wafer in the wafer processing system 1. In addition, the program was recorded on a non-transitory computer-readable storage medium H and may be installed from the storage medium H to the controller 100.

<Operation of Wafer Processing System>

The wafer processing system 1 is configured as described above. Next, an example of a wafer process performed using the wafer processing system 1 configured as described above will be described.

First, the cassette C accommodating the plurality of wafers W is loaded into the cassette station 2 of the wafer processing system 1 and is placed on the cassette placing table 21. Next, each wafer W in the cassette C is sequentially taken out by the wafer transfer device 22 or the wafer transfer device 23 and is transferred to the delivery device 103 of the third block G3.

The wafer W transferred to the delivery device 103 of the third block G3 is supported by the wafer transfer device 33 and is transferred to the hydrophobization apparatus provided in the second block G2, to be subjected to the hydrophobization process. Next, the wafer W is transferred to the resist film forming apparatus by the wafer transfer device 33 to form a resist film on the wafer W, and is then transferred to the thermal-processing unit for pre-baking, followed by being transferred to the delivery device 105 of the fifth block G5. In addition, when the plurality of processing stations 3 are provided as illustrated in FIGS. 1 and 2, before being transferred to the delivery device 105 of the fifth block G5, the wafer W is temporarily placed on the delivery device 104 of the fourth block G4 and is delivered between the plurality of wafer transfer devices 33. Further, the wafer W may be transferred to the peripheral exposure apparatus by the wafer transfer device 33 as needed to allow the peripheral edge of the wafer W to be exposed.

The wafer W transferred to the delivery device 105 of the fifth block G5 is transferred to the exposure apparatus by the wafer transfer devices 41 and 42 and is exposed to obtain a predetermined pattern. In addition, the wafer W may be cleaned with the cleaning apparatus before exposure.

The exposed wafer W is transferred to the delivery device 105 of the fifth block G5 by the wafer transfer devices 41 and 42. Thereafter, the wafer W is transferred to the thermal-processing unit by the wafer transfer device 33 and is subjected to post-exposure baking.

The wafer W, subjected to the post-exposure baking, is transferred by the wafer transfer device 33 to the developing apparatus, where the wafer is developed. After the end of developing, the wafer W is transferred by the wafer transfer device 33 to the thermal-processing unit and is subjected to post-baking.

Thereafter, the wafer W is transferred to the delivery device 103 of the third block G3 by the wafer transfer device 33, and is in turn transferred to the cassette C on the predetermined cassette placing table 21 by the wafer transfer device 22 or the wafer transfer device 23 in the cassette station 2. In this way, a series of photolithography processes are completed.

<Nitrogen Atmosphere Placement Stage>

Next, a nitrogen atmosphere placement stage will be described with reference to FIGS. 3A to 13B. In the present embodiment, a metal oxide resist (MOR) is used as a resist that forms a pattern on the wafer W. The MOR is a resist that uses a reaction of metal oxides to change the solubility of exposed and unexposed portions, to form a pattern. An MOR film formed on a substrate contains a metal compound having ligands (coordination molecules). As an example, in a negative developing step, some ligands of the metal compound are separated in the exposed portion of the MOR film, and subsequently, separated metals bind together through a condensation reaction, causing them insoluble in a negative developer. The MOR is used in EUV lithography because of high resolution thereof.

The procedure from the separation of some ligands in the MOR film to the condensation reaction is referred to as a series of MOR film reactions. In the MOR film formed on the wafer W, the amount of moisture such as humidity in the atmosphere of a space where the wafer W exists and the concentration of various gas species affect the progress of a series of MOR film reactions. Here, when the wafer W after MOR film formation (wafer W before and after exposure) is on standby in the normal air environment (air), it is conceivable that the standby time and others cause a variation in critical dimension (CD), making it impossible to obtain a good pattern on the wafer W. In the wafer processing system 1 according to the present embodiment, a nitrogen atmosphere placement stage is provided as a component for preventing a variation in CD. The nitrogen atmosphere placement stage is provided on a transfer path for the wafer W before and after exposure, and is configured to place the wafer W in the environment where the nitrogen concentration of the atmosphere is set higher than that of the air (i.e., the concentration of oxygen and carbon dioxide is set lower than that of the air). Here, nitrogen may be, for example, dry nitrogen. The wafer processing system 1 is provided with a plurality of nitrogen atmosphere placement stages. Hereinafter, an example of each nitrogen atmosphere placement stage will be described.

Figure 3A:
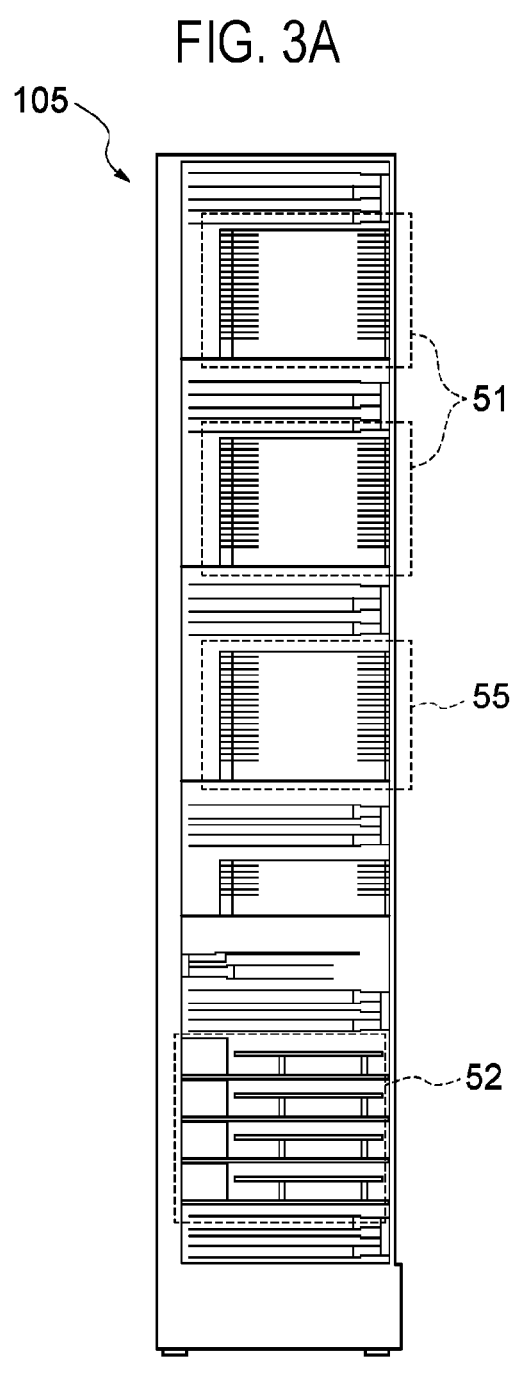

First, a nitrogen atmosphere placement stage 51 (see FIGS. 3A and 3B) provided in the delivery device 105 of the fifth block G5 will be described as an example of the nitrogen atmosphere placement stage. FIG. 3A is a front view schematically illustrating an example of the layout of the delivery device 105 of the fifth block G5.

The delivery device 105 is provided in the fifth block G5 (see FIG. 2) to transfer the wafer W between the fifth block and the exposure apparatus, and as illustrated in FIG. 3A, is a tower-shaped device in which a plurality of accommodation spaces are formed vertically at multiple levels. The delivery device 105 includes, as the plurality of accommodation spaces, nitrogen atmosphere placement stages 51 and 51, a pre-exposure cooler 52, and an air atmosphere placement stage 55. In the example illustrated in FIG. 3A, the delivery device 105 includes the nitrogen atmosphere placement stages 51 and 51 provided respectively at the topmost level and at the second level from the top. Further, the delivery device 105 includes the pre-exposure cooler 52 at the lowest level and the air atmosphere placement stage 55 provided between the nitrogen atmosphere placement stage 51 and the pre-exposure cooler 52.

As described above, the nitrogen atmosphere placement stages 51 are provided in two accommodation spaces in the delivery device 105. The nitrogen atmosphere placement stage 51 is configured to place the wafer W in the environment with the nitrogen concentration of the atmosphere set higher than that of the air by supplying nitrogen while the wafer W is placed. The nitrogen atmosphere placement stage 51 is configured to place the wafer W after MOR film formation and before exposure. In detail, the nitrogen atmosphere placement stage 51 places, for example, the pre-exposure wafer W which is a wafer having, e.g., the MOR film formed thereon and transferred to the thermal-processing unit to be subjected to pre-baking process. As such, the nitrogen atmosphere placement stage 51 is a nitrogen atmosphere placement stage provided on a first transfer path, which is a transfer path for the wafer W after MOR film formation and before exposure. The nitrogen atmosphere placement stage 51 is configured to be capable of placing a plurality of wafers W.

The air atmosphere placement stage 55 is configured to place the wafer W after MOR film formation and before exposure in the air environment. The air atmosphere placement stage 55 is configured to place, for example, the wafer, which has a resist film other than the MOR and which is desired to be on standby in the air environment. The resist film may be, for example, a chemical amplification resist (CAR) film. The air atmosphere placement stage 55 is provided in one of the accommodation spaces in the delivery device 105 where the nitrogen atmosphere placement stage 51 is not provided. The air atmosphere placement stage 55 have in common with the nitrogen atmosphere placement stage 51 in placing the pre-exposure wafer W, but differs from the nitrogen atmosphere placement stage 51 in that it places the wafer W in the air environment. The air atmosphere placement stage 55 is configured to be capable of placing a plurality of wafers W. The air atmosphere placement stage 55 has a substantially common configuration with the nitrogen atmosphere placement stage 51 to be described later, except that it does not have components related to the supply of nitrogen.

The pre-exposure cooler 52 is configured to have a cooling plate that cools, before exposure, the wafer having the MOR film thereon and subsequently subjected to pre-baking in the thermal-processing unit. The pre-exposure cooler 52 is configured to be capable of cooling a plurality of wafers W.

In addition, when the delivery device 105 illustrated in FIG. 3A is used, the fifth block G5 may be provided therein with, for example, a nitrogen atmosphere placement stage (not illustrated) for placing a post-exposure wafer W with the MOR film. The nitrogen atmosphere placement stage for placing the post-exposure wafer W may have the same configuration as the above-described nitrogen atmosphere placement stage 51.

Figure 3B:
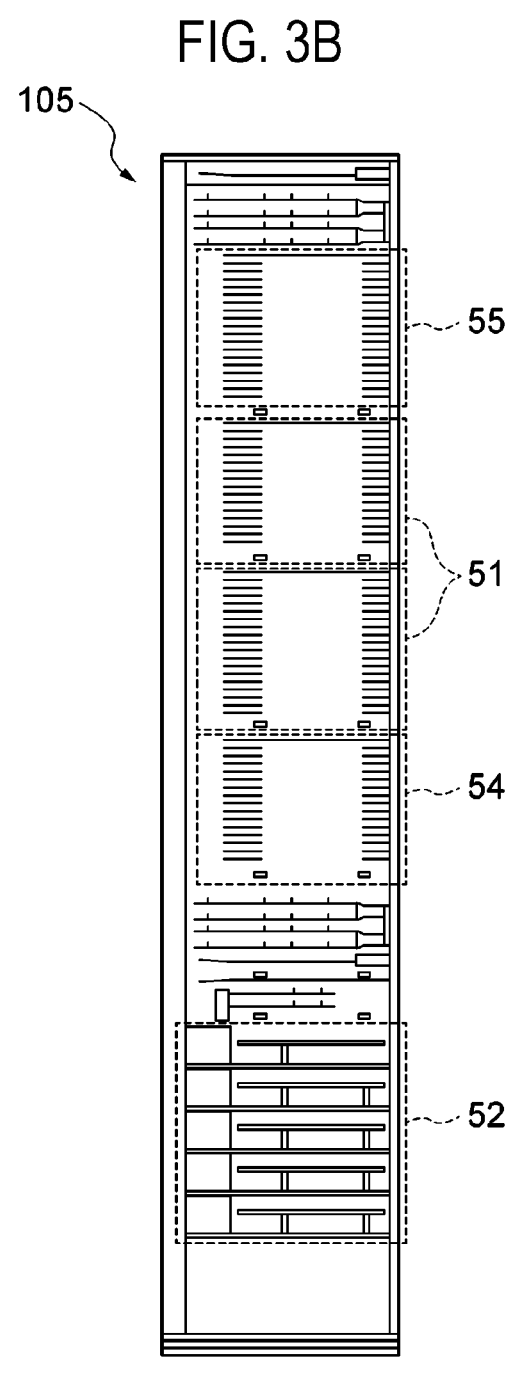

The layout of the delivery device 105 is not limited to the embodiment illustrated in FIG. 3A. The layout of the delivery device 105 may be based on, for example, the embodiment illustrated in FIG. 3B. FIG. 3B is a front view schematically illustrating another example of the layout of the delivery device 105 of the fifth block G5.

In the example illustrated in FIG. 3B, in the delivery device 105, the air atmosphere placement stage 55 is provided at the topmost level, the nitrogen atmosphere placement stages 51 and 51 are provided at two levels immediately below the topmost level, respectively, and the pre-exposure cooler 52 is provided at the lowest level. Further, a nitrogen atmosphere placement stage 54 for placing the post-exposure wafer W with the MOR film is provided between the nitrogen atmosphere placement stage 51 and the pre-exposure cooler 52. As such, in the example illustrated in FIG. 3B, the nitrogen atmosphere placement stage 54 for placing the post-exposure wafer W with the MOR film, which is provided outside the delivery device 105 in the example illustrated in FIG. 3A, is provided in the delivery device 105. The nitrogen atmosphere placement stage 54 may have the same configuration as the above-described nitrogen atmosphere placement stage 51.

Figure 4:
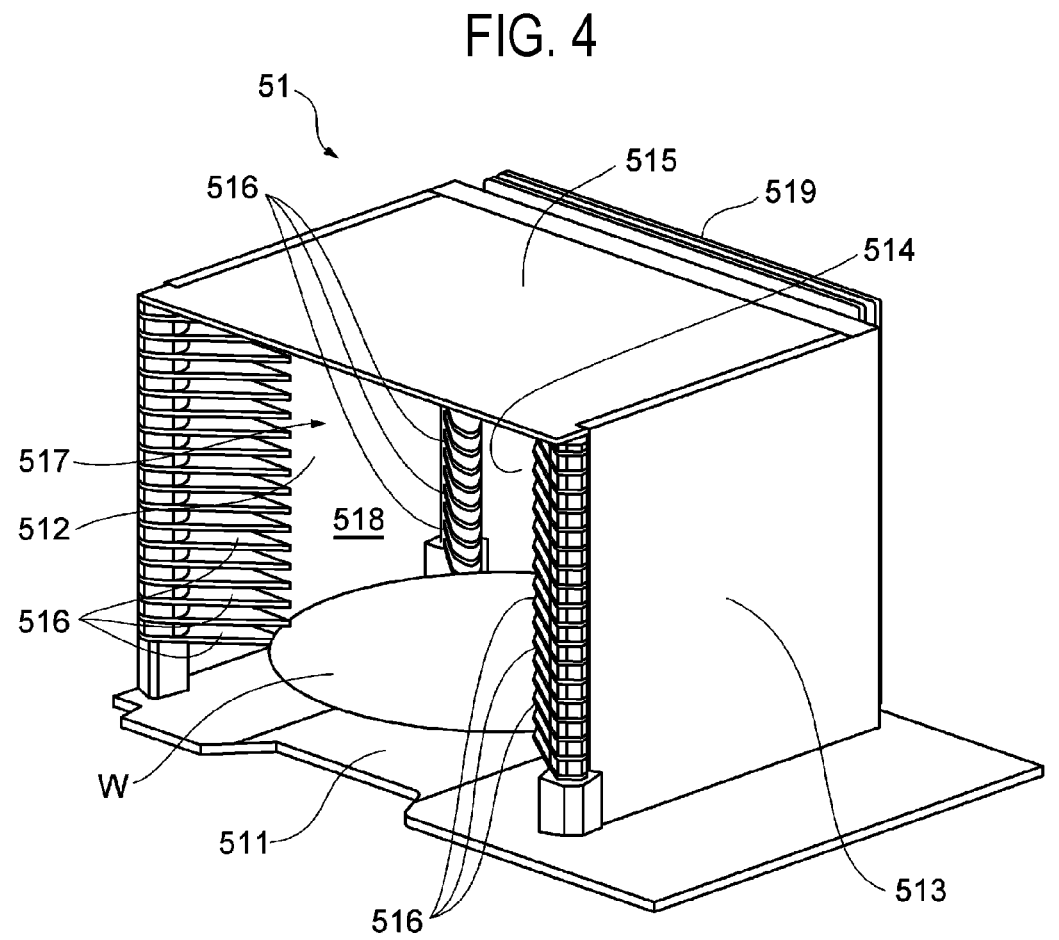
FIG. 4 is a perspective view schematically illustrating a nitrogen atmosphere placement stage with a slot structure arranged in the delivery device of the fifth block.
Figure 5:
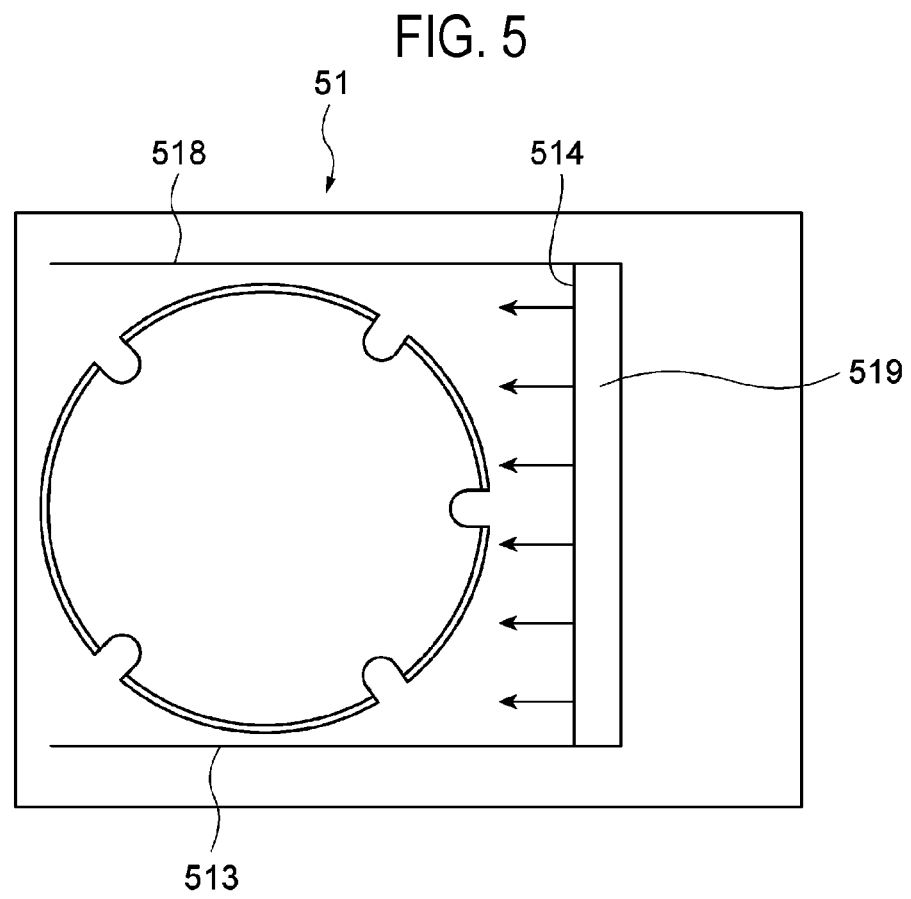
FIG. 5 is a plan view schematically illustrating the nitrogen atmosphere placement stage with a slot structure.

Next, details of the nitrogen atmosphere placement stage 51 provided in the delivery device 105 will be described with reference to FIGS. 4 to 9C. FIG. 4 is a perspective view schematically illustrating the nitrogen atmosphere placement stage 51 with a slot structure arranged in the delivery device 105 of the fifth block G5. FIG. 5 is a plan view schematically illustrating the nitrogen atmosphere placement stage 51 with a slot structure. In addition, in FIG. 5, the illustration of some components of the nitrogen atmosphere placement stage 51 (e.g., slot divider 516 to be described later) is omitted.

As illustrated in FIG. 4, the nitrogen atmosphere placement stage 51 has a base 511, wall portions 512, 513, and 514, a roof portion 515, and a plurality of slot dividers 516. The base 511 is a bottom portion where the wall portions 512, 513, and 514 stand upright. The wall portions 512 and 513 extend in the vertical direction so as to face each other. The wall portion 514 is provided in a direction crossing the wall portions 512 and 513 and extends in the vertical direction. An opening 517 for the introduction of the wafer W is formed in an area facing the wall portion 514. The roof portion 515 is provided to face the base 511 and is arranged to cover top surfaces of the wall portions 512, 513, and 514. A space defined by the base 511, wall portions 512, 513, and 514, and roof portion 515 is an accommodation space 518 for accommodating the wafer W. As described above, the opening 517 is formed in a portion where the wafer W is introduced into the accommodation space 518. The wall portions 512, 513, and 514 are provided respectively at three sides among four sides around the wafer W accommodated in a slot, excluding the opening 517, which is an introduction port for the wafer W.

The plurality of slot dividers 516 serve to define a plurality of slots where the wafer W is accommodated. The plurality of slot dividers 516 are provided respectively at a boundary between the wall portion 512 and the opening 517, a boundary between the wall portion 512 and the wall portion 514, a boundary between the wall portion 513 and the wall portion 514, and a boundary between the wall portion 513 and the opening 517. The plurality of slot dividers 516 extend toward the center side of the wafer W, respectively. The slot dividers 516 extend from the above-described four boundaries toward the center side of the wafer W. Four slot dividers 516 at the same height constitute one set, and one wafer W is placed on the slot dividers 516 of one set. In this way, the respective wafers W can be placed at different heights in the vertical direction. The nitrogen atmosphere placement stage 51 is a placement stage with a so-called slot structure that accommodates the wafer W in each slot. In addition, in FIG. 4, only one wafer W placed on the lowermost slot dividers 516 is illustrated.

Furthermore, as illustrated in FIG. 5, the nitrogen atmosphere placement stage 51 includes a nitrogen supplier 519 (second nitrogen supplier) that supplies nitrogen to the accommodation space 518. The nitrogen supplier 519 is formed in the wall portion 514, which is an area facing the opening 517, and supplies nitrogen toward the opening 517, thereby supplying nitrogen to the accommodation space 518. The nitrogen supplier 519 may be, for example, holes formed in the wall portion 514, and may be configured to guide nitrogen directed from a nitrogen source (not illustrated) toward the opening 517. With this configuration, in addition to efficiently accommodating a plurality of wafers W with a slot structure, it is possible to supply nitrogen to a space surrounded by the three wall portions 512, 513, and 514 excluding the opening 517, thereby allowing the wafers W to be on standby in the high nitrogen concentration environment.

Figure 6:
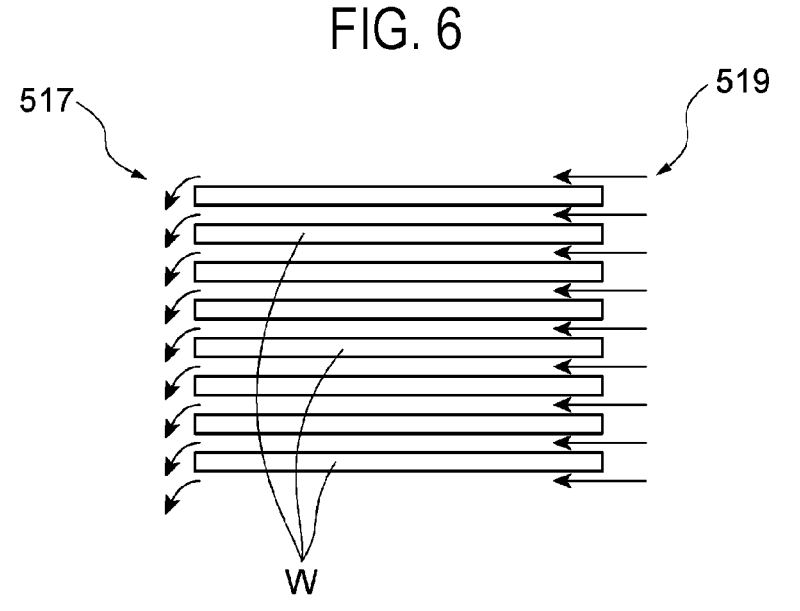
FIG. 6 is an explanatory diagram illustrating a sideflow in the nitrogen atmosphere placement stage with a slot structure.

FIG. 6 is an explanatory diagram illustrating a sideflow in the nitrogen atmosphere placement stage 51 with a slot structure. In FIG. 6, the flow of nitrogen (flow indicated by arrows) between the respective wafers W in the accommodation space 518 is schematically illustrated. As illustrated in FIG. 6, the nitrogen supplied from the nitrogen supplier 519 flows between the respective wafers W to reach the opening 517, and is then discharged downward from the opening 517.

Figure 7:
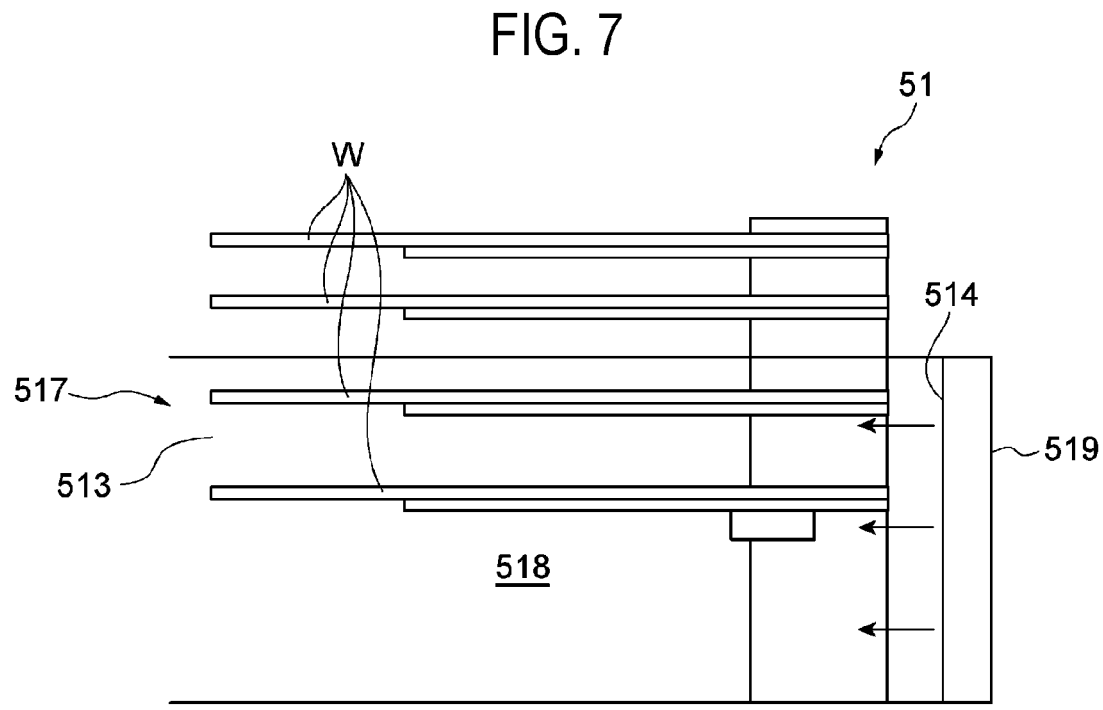
FIG. 7 is a side view schematically illustrating the nitrogen atmosphere placement stage with a slot structure according to a modification.

The nitrogen atmosphere placement stage 51 with a slot-structure is not limited to the above-described embodiment. FIG. 7 is a side view schematically illustrating the nitrogen atmosphere placement stage 51 with a slot structure according to a modification. In the nitrogen atmosphere placement stage 51 illustrated in FIG. 7, some wafers W (for example, two wafers from the top) are arranged above the accommodation space 518 surrounded by the wall portions 512, 513, and 514. With this configuration, for example, in a situation in which the transfer device should access from directions other than the opening 517, the transfer device is accessible from multiple directions without being obstructed by the wall portions 512, 513, and 514 in an area corresponding to the two wafers W on the top. The nitrogen atmosphere placement stage 51 with a slot structure according to this modification may be provided, for example, in the delivery device 103 of the third block G3.

Figures 8A, 8B, 8C, 8D, 8E, 8F, 8G, 8H, 8I:
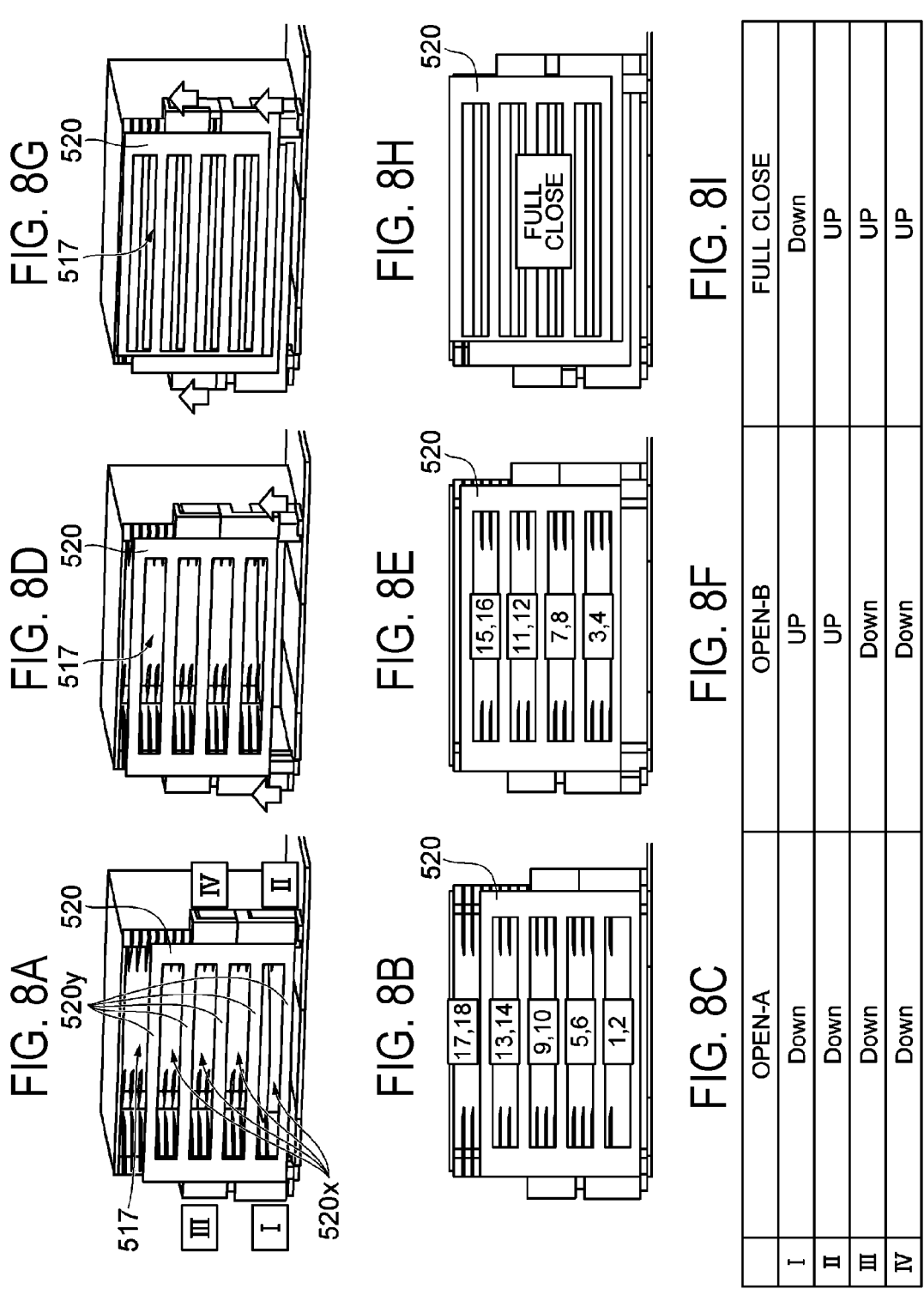
FIG. 8A is a perspective view illustrating a shutter state in an "OPEN-A" mode.
FIG. 8B is a front view illustrating the shutter state in the "OPEN-A" mode.
FIG. 8C is a table illustrating the Up or Down of each cylinder in the "OPEN-A" mode.
FIG. 8D is a perspective view illustrating a shutter state in an "OPEN-B" mode.
FIG. 8E is a front view illustrating the shutter state in the "OPEN-B" mode.
FIG. 8F is a table illustrating the UP or Down of each cylinder in the "OPEN-B" mode.
FIG. 8G is a perspective view illustrating a shutter state in a "FULL-CLOSE" mode.
FIG. 8H is a front view illustrating the shutter state in the "FULL-CLOSE" mode.
FIG. 8I is a table illustrating the Up or Down of each cylinder in the "FULL-CLOSE" mode.

Further, the opening 517 of the nitrogen atmosphere placement stage 51 with a slot structure may be further provided with four shutters 520 (see FIG. 8A, etc.), which serve as opening/closing parts. As illustrated in FIG. 8A, the four shutters 520 each have four passage regions 520x arranged side by side in the vertical direction to allow the access of the transfer device. Shields 520y, which do not allow the access of the transfer device, are provided above and below each of the four passage regions 520x. In other words, each shield 520y is provided between the adjacent passage regions 520x and 520x in the vertical direction. The four shutters are arranged side by side at shifted positions in the direction (depth direction) from the opening 517 to the inside of the nitrogen atmosphere placement stage 51. When the respective shutters 520 move relative to each other in the vertical direction, areas of the opening 517 facing some of the plurality of slots are opened. Cylinders I, II, III, and IV are provided as components for opening and closing the four shutters 520. Cylinder I is used to vertically move two corresponding shutters 520 among the four shutters 520. Cylinder II is used to vertically move two shutters 520, among the four shutters 520, which are not vertically moved by cylinder I. Cylinder III is used to vertically move only one shutter 520 among the two shutters 520 which are vertically moved by cylinder I. Further, cylinder III is fixed to cylinder I so as to vertically move the same distance as cylinder I during the vertical movement of cylinder I. Cylinder IV is used to vertically move only one shutter 520 among the two shutters 520 which are vertically moved by cylinder II. Further, cylinder IV is fixed to cylinder II so as to vertically move the same distance as cylinder II during the vertical movement of cylinder II. The vertical movement range of the shutter 520 due to a single vertical movement by each cylinder I, II, III, or IV is the same for all. That is, the relative position between the two shutters corresponding to cylinder I is adjusted by the vertical movement of cylinder III, and the relative position between the other two shutters corresponding to cylinder II is adjusted by the vertical movement of cylinder IV.

Figure 9A:
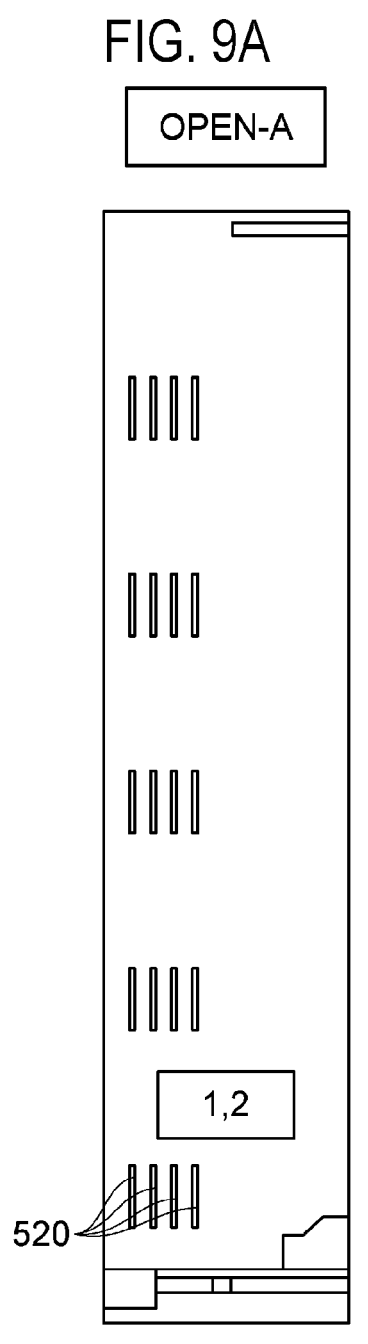
Figure 9B:
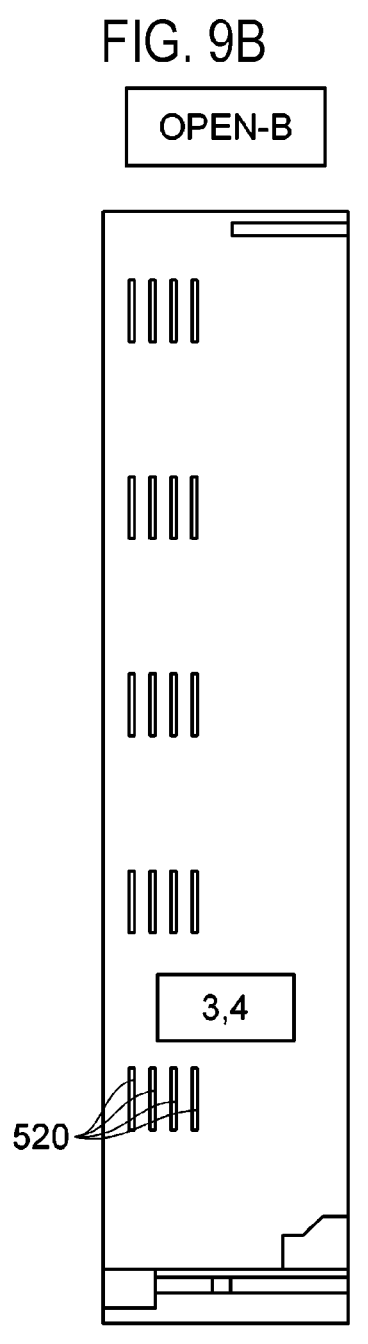
Figure 9C:
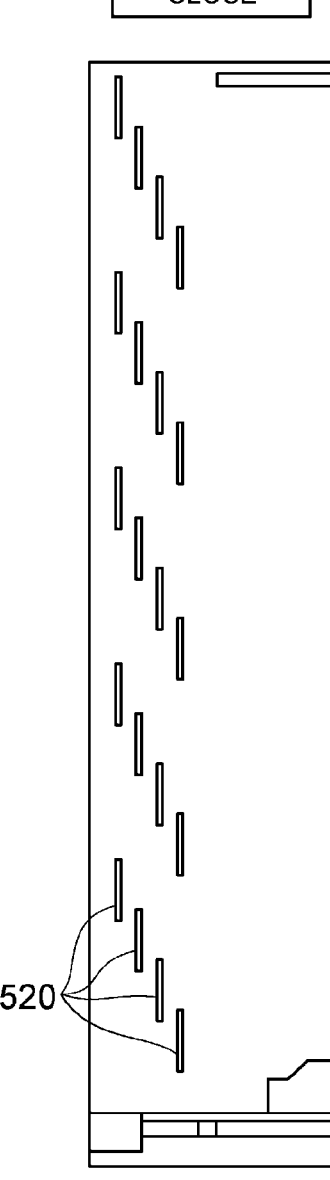
FIG. 9C is a side view schematically illustrating the shutter state in the "FULL-CLOSE" mode.

The above-described shutters 520 may be allowed to switch the accessible area of the transfer device depending on, for example, three modes. Here, the three modes are described as "OPEN-A" mode, "OPEN-B" mode, and "FULL-CLOSE" mode. FIG. 8A is a perspective view illustrating a shutter state in the "OPEN-A" mode, FIG. 8B is a front view illustrating the shutter state in the "OPEN-A" mode, and FIG. 8C is a table illustrating the Up or Down of each cylinder in the "OPEN-A" mode. FIG. 8D is a perspective view illustrating a shutter state in the "OPEN-B" mode, FIG. 8E is a front view illustrating the shutter state in the "OPEN-B" mode, and FIG. 8F is a table illustrating the UP or Down of each cylinder in the "OPEN-B" mode. FIG. 8G is a perspective view illustrating a shutter state in the "FULL-CLOSE" mode, and FIG. 8H is a front view illustrating the shutter state in the "FULL-CLOSE" mode. FIG. 8I is a table illustrating the Up or Down of each cylinder in the "FULL-CLOSE" mode. FIG. 9A is a side view schematically illustrating the shutter state in the "OPEN-A" mode, and FIG. 9B is a side view schematically illustrating the shutter state in the "OPEN-B" mode. FIG. 9C is a side view schematically illustrating the shutter state in the "FULL-CLOSE" mode.

As illustrated in FIG. 8C, in the "OPEN-A" mode, all cylinders I, II, III, and IV are in the Down state. In this case, as illustrated in FIG. 9A, the four shutters 520 are all located at the same height positions, their passage regions 520x overlap each other, and their shields 520y overlap each other. As illustrated in FIG. 8B, for example, it is assumed that a maximum of 18 wafers W may be accommodated in the accommodation space 518. In this case, the wafers numbered 1st, 2nd, 5th, 6th, 9th, 10th, 13th, 14th, 17th, and 18th from the bottom are able to be accommodated from the respective passage regions 520x. Further, the wafers numbered 3rd, 4th, 7th, 8th, 11th, 12th, 15th, and 16th from the bottom are unable to be accommodated by the shields 520y.

As illustrated in FIG. 8F, in the "OPEN-B" mode, cylinders I and II are in the Up state and cylinders III and IV are in the Down state. In this case, as illustrated in FIG. 9B, the four shutters 520 are all located at the same height positions, their passage regions 520x overlap each other, and their shields 520y overlap each other. On the other hand, since cylinders I and II are in the Up state, the four shutters 520 are moved upward by one level, compared to the state illustrated in FIG. 9A. In this case, as illustrated in FIG. 8E, for example, the wafers numbered 3rd, 4th, 7th, 8th, 11th, 12th, 15th, and 16th from the bottom are able to be accommodated from the respective passage regions 520x. Further, the wafers numbered 1st, 2nd, 5th, 6th, 9th, 10th, 13th, 14th, 17th, and 18th from the bottom are unable to be accommodated by the shields 520y.

As illustrated in FIG. 8I, in the "FULL-CLOSE mode, only cylinder I is in the Down state and cylinders II III and IV are in the Up state. In this case, as illustrated in FIG. 9C, the four shutters 520 are all at different height positions. Therefore, all of the passage regions 520x of the four shutters 520 overlap with the shields 520y of the other shutters 520, as illustrated in FIG. 9C. In this case, as illustrated in FIG. 8H, none of the wafers W are accessible to (able to be accommodated in) the accommodation space 518 due to the shields 520y.

The "OPEN-A" mode and the "OPEN-B" mode can be said to be open forms of the nitrogen atmosphere placement stage 51 with different accessible areas for the transfer device. Further, the "FULL-CLOSE" mode can be said to be a closed form of the nitrogen atmosphere placement stage 51. In other words, the nitrogen atmosphere placement stage 51 with a slot structure as illustrated in FIG. 8A and others is set to one of a plurality of open forms with different height positions where the passage regions of the plurality of shutters overlap depending on an accommodation location accessed by the transfer device. Further, it is set to the closed form where the height positions of the passage regions of the plurality of shutters are shifted.

With this configuration, it is possible to simply control the area accessible by the transfer device by binary Up/Down control of cylinders I, II, III, and IV corresponding to the respective shutters 520. The distance of the vertical movement by each cylinder during switching between opening and closing is determined from the pitch of the vertically arranged passage regions. Hence, since, for each shutter, a plurality of passage regions vertically arranged with each other is provided by a plurality of shields, the distance of the vertical movement of one cylinder is limited, resulting in a compact vertical movement mechanism for the shutter including the cylinder. In addition, in the present embodiment, the vertical width of one shield in one shutter is smaller than that of one passage region. Further, the number of shutters 520 may two other than four, but providing four shutters may be desired from the viewpoint of more effective shielding of the opening 517 and ensuring the rigidity of the shutters. By limiting the area accessible by the transfer device through the use of the shutters 520, it is possible to effectively prevent the influence of external disturbance caused by, e.g., the movement of the transfer device on the wafer W accommodated in the accommodation space 518.

Further, as described above, a plurality of shutters are provided at shifted positions in the depth direction, but all of the shutters may not be in contact with each other in all open and closed forms. For example, as illustrated in FIGS. 9A to 9C, two shutters may be arranged with a gap in the depth direction therebetween. Even in the closed form, it is not necessary to completely seal an internal space as long as gas (nitrogen) is continuously inwardly supplied and the concentration of the supplied gas is maintained at a desired degree. For example, since the concentration of the supplied gas is maintained at the desired degree even when all of the shutters are made non-contact with tiny gaps therebetween, it is possible to ensure the supply of the gas at a sufficient flow rate. The term "desired degree" at this time refers to a value that is set appropriately higher than the concentration of that gas in the air based on various process conditions (e.g., film thickness and target CD) that do not cause MOR pattern defects.

In addition, as described above, in addition to providing the nitrogen atmosphere placement stage 51 on the first transfer path, which is a transfer path for the wafer W after MOR film formation and before exposure, the nitrogen atmosphere placement stage 54 may be provided on a second transfer path, which is a transfer path after exposure. In this case, the nitrogen concentration in the nitrogen atmosphere placement stage 51 on the first transfer path may be set lower than that in the nitrogen atmosphere placement stage 54 on the second transfer path. For example, the above-described shutter may not be provided in the nitrogen atmosphere placement stage 51 on the first transfer path, but may be provided only in the nitrogen atmosphere placement stage 54 on the second transfer path. This allows the nitrogen concentration in the nitrogen atmosphere placement stage 54 on the second transfer path to be higher than that in the nitrogen atmosphere placement stage 51 on the first transfer path.

Next, a nitrogen atmosphere placement stage 53 (see FIGS. 10 and 11B) provided in the pre-exposure cooler 52 in the delivery device 105 of the fifth block G5 will be described as another example of the nitrogen atmosphere placement stage. The nitrogen atmosphere placement stage 53 is a nitrogen atmosphere placement stage with a chamber structure (details will be described later).

Figure 10:
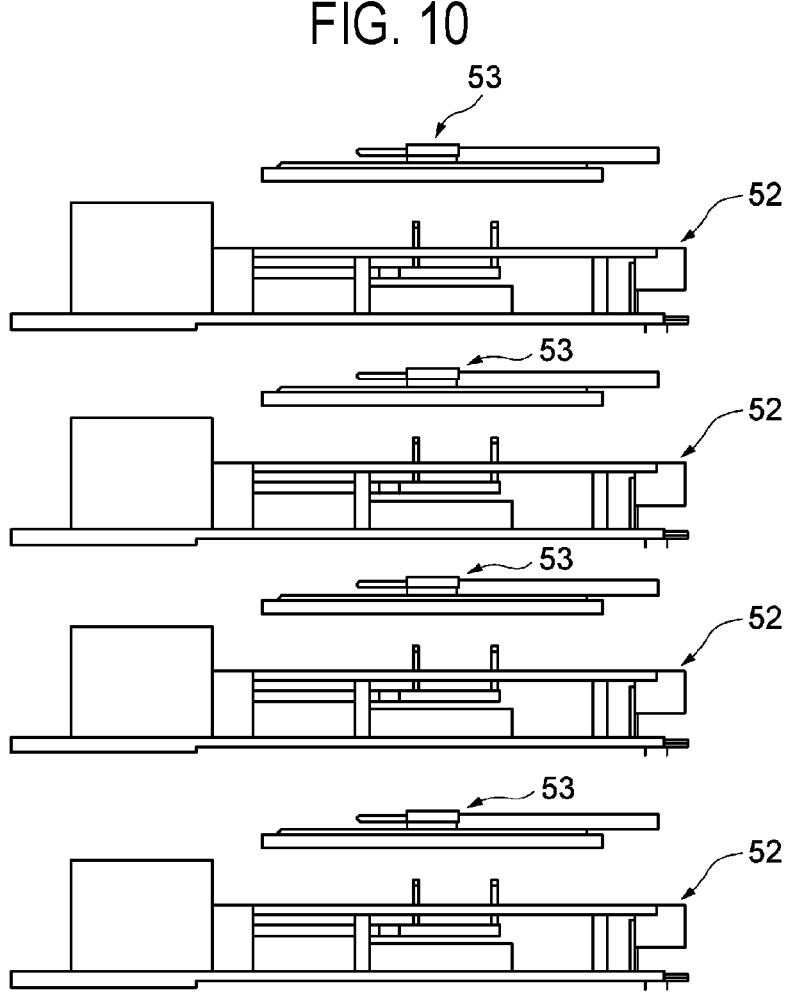
FIG. 10 is a front view schematically illustrating a nitrogen atmosphere placement stage with a chamber structure arranged in the delivery device of the fifth block.
Figure 11A:
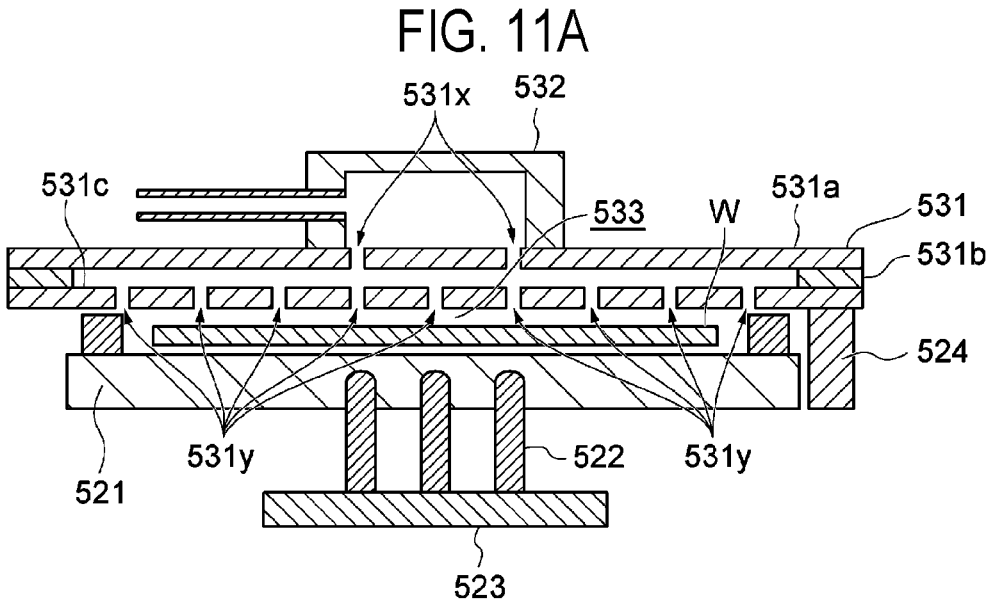
FIG. 11A is a cross-sectional view schematically illustrating a nitrogen atmosphere placement stage with a chamber structure.

FIG. 10 is a front view schematically illustrating the nitrogen atmosphere placement stage 53 with a chamber structure arranged in the delivery device 105 of the fifth block G5. FIG. 11A is a cross-sectional view schematically illustrating the nitrogen atmosphere placement stage 53 with a chamber structure. Here, the nitrogen atmosphere placement stage 53 with a chamber structure is described as being provided in the pre-exposure cooler 52, but the nitrogen atmosphere placement stage 53 with a chamber structure may be provided instead of the above-described nitrogen atmosphere placement stage 51 with a slot structure.

As illustrated in FIG. 10, the nitrogen atmosphere placement stage 53 is provided above the pre-exposure cooler 52 to correspond to each of a plurality of pre-exposure coolers 52 provided in the delivery device 105.

As illustrated in FIG. 11A, the pre-exposure cooler 52 includes, as main components, a cooling plate 521, a lift pin 522, a drive 523, and a positioner 524. The cooling plate 521 is a disk-shaped cooling plate that cools the wafer W by placing the wafer W thereon. The cooling plate 521 is kept at a low temperature by, for example, a coolant supplied from a coolant supplier (not illustrated) and cools the wafer W placed thereon. The lift pin 522 is used to raise and lower the wafer W. The lift fin 522 extends in the vertical direction so as to penetrate the cooling plate 521. A plurality of (for example, three) lift pins 522 may be equidistantly arranged in the circumferential direction around the center of the cooling plate 521. The drive 523 raises and lowers the lift pin 522 based on operation instructions from the controller 100. The drive 523 includes, for example, a driving source such as an electric motor. The positioner 524 is configured to come into contact with a sidewall 531b of a cover 531 of the nitrogen atmosphere placement stage 53 to be described later, thereby positioning the cover 531 to prevent further downward movement of the cover 531. The positioner 524 extends in the vertical direction from the lateral side of the cooling plate 521.

As illustrated in FIG. 11A, the nitrogen atmosphere placement stage 53 includes the cover 531 and a nitrogen supplier 532 (first nitrogen supplier).

The cover 531 is provided to surround the cooling plate 521, which is a support surface for supporting the wafer W. The cover 531 has a ceiling plate 531a, the sidewall 531b, and a flow path forming plate 531c. The ceiling plate 531a is configured in a disk shape with approximately the same diameter as that of the cooling plate 521. The ceiling plate 531a is arranged to face the cooling plate 521 in the vertical direction. The sidewall 531b is configured to extend downward from the outer edge of the ceiling plate 531a. The sidewall 531b is configured to come into contact at a portion thereof with the positioner 524 when the cover 531 moves downward, thereby preventing further downward movement of the cover 531. In addition, the portion of the sidewall 531b that comes into contact with the positioner 524 may be removed, which allows the entire cover 531 to be made thinner, resulting in a reduction in the space required for raising and lowering the cover 531.

Figure 11B:
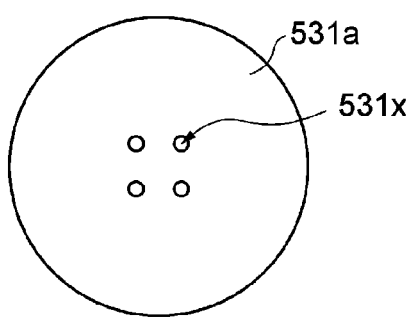
FIG. 11B is a plan view of a ceiling plate.
Figure 11C:
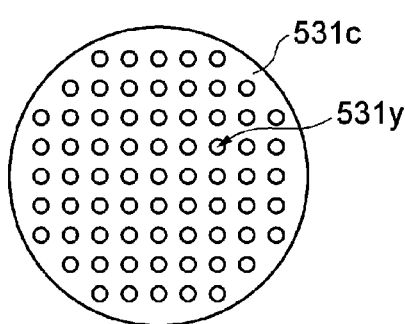
FIG. 11C is a plan view of a flow path forming plate.

The flow path forming plate 531c is a plate-shaped member that extends parallel to the ceiling plate 531a in the space surrounded by the ceiling plate 531a and the sidewall 531b and is formed with a plurality of through-holes 531y. As illustrated in FIGS. 11B and 11C, the ceiling plate 531a is formed with through-holes 531x at a plurality of positions (for example, four positions) around the center thereof. Further, the plurality of through-holes 531y are formed in the flow path forming plate 531c over a wide area covering most of the wafer surface. The spacing between the through-holes 531y is set smaller than the spacing between the through-holes 531x. Nitrogen supplied from the nitrogen supplier 532 to be described later is evenly supplied to the wide area of the wafer W through the through-holes 531x in the ceiling plate 531a and the through-holes 531y in the flow path forming plate 531c.

The nitrogen supplier 532 is provided near the center of the ceiling plate 531a, and is configured to supply nitrogen to a space 533 defined by the cooling plate 521 and the cover 531 (specifically, the ceiling plate 531a and the sidewall 531b). The nitrogen supplier 532 is connected to a nitrogen source (not illustrated), for example, through a supply pipe (not illustrated). By supplying nitrogen to the space 533, the nitrogen supplier 532 enables the cooling of the wafer W by the pre-exposure cooler 52 in the high nitrogen concentration environment. In addition, the provision of the positioner 524 as illustrated in FIG. 11A ensures that the lateral side of the wafer W is not surrounded by the cover 531 in the closed state of the cover 531, thereby allowing nitrogen to be supplied from the nitrogen supplier 532 through a gap. In this case, the cover 531 that is configured to be raised and lowered may be thin, so that the stroke of the cover 531 for its upward movement which is required for a transfer mechanism to access above the cooling plate 521 may be shortened, which makes it easier to provide the nitrogen atmosphere placement stages 53 vertically at multiple levels.

Next, a nitrogen atmosphere placement stage 70 (see FIGS. 12 to 13B) provided in a thermal-processing unit U2 in the second block G2 will be described as a further example of the nitrogen atmosphere placement stage. The nitrogen atmosphere placement stage 70 is a nitrogen atmosphere placement stage with a chamber structure. The nitrogen atmosphere placement stage 70 is provided on the second transfer path, which is a transfer path for the wafer W after exposure.

Figure 12:
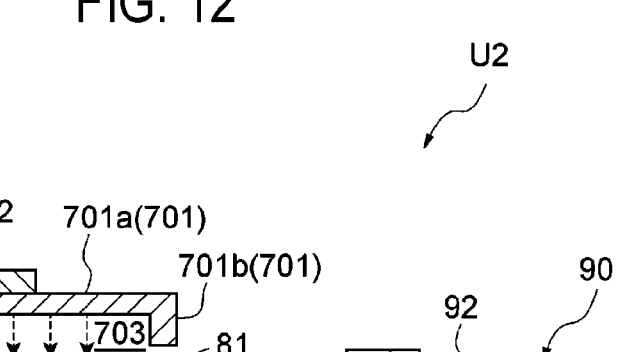
FIG. 12 is a cross-sectional view schematically illustrating a nitrogen atmosphere placement stage with a chamber structure disposed on a cooling plate that is connected to a hot plate.

FIG. 12 is a cross-sectional view schematically illustrating the nitrogen atmosphere placement stage 70 with a chamber structure disposed on a cooling plate 81 connected to a hot plate 91 of the thermal-processing unit U2. The thermal processing unit U2 is configured to perform thermal processing including heating and cooling on the wafer W. As illustrated in FIG. 12, the thermal processing unit U2 includes the nitrogen atmosphere placement stage 70, a cooling part 80, and a heating part 90. In addition, a configuration including the cooling part 80 and the heating part 90 may be surrounded by a housing (not illustrated).

The heating part 90 performs a heating process on the wafer W to heat the wafer W. The heating part 90 includes, for example, the hot plate 91, a cover 92, a plurality of lift pins 93, and a drive 94. The hot plate 91 is a plate that heats the wafer W placed thereon. The hot plate 91 is formed, for example, in a disk shape. A heater (not illustrated) is provided on a surface of the hot plate 91 opposite to a surface on which the wafer W is placed. The temperature of the hot plate 91 rises when the heater generates heat upon receiving current applied thereto. Thus, the wafer W placed on the hot plate 91 is heated. The cover 92 is configured to surround a placement surface of the hot plate 91. The lift pins 93 are used to raise and lower the wafer W. The lift fins 93 extend in the vertical direction so as to penetrate the hot plate 91. The plurality of (for example, three) lift pins 93 are equidistantly arranged in the circumferential direction around the center of the hot plate 91. The drive 94 raises and lowers the lift pins 93 based on operation instructions from the controller 100. The drive 94 includes, for example, a driving source such as an electric motor.

The cooling part 80 performs a cooling process on the wafer W to lower the temperature of the wafer W to a target temperature. The cooling part 80 facilitates the delivery of the wafer W to and from the wafer transfer device 33 outside the thermal-processing unit U2. The cooling part 80 includes, for example, the cooling plate 81, a connecting bracket 82, and a drive 83. The cooling plate 81 is a plate (cool plate) that cools the wafer W. The cooling plate 81 cools the wafer W to the target temperature while the wafer W heated by the heating part 90 is positioned above the cooling plate 81. The cooling plate 81 may be formed in a disk shape. The cooling plate 81 may be made of a metal such as aluminum, silver, or copper. The interior of the cooling plate 81 is formed with a coolant flow path (not illustrated) through which a coolant such as cooling water or cooling gas circulates. The coolant flowing inside the cooling plate 81 takes heat from the wafer W, thereby lowering the temperature of the wafer W. The connecting bracket 82 is connected to the cooling plate 81. The connecting bracket 82 is configured to be movable in one horizontal direction. The connecting bracket 82 is movable, for example, along a guide rail (not illustrated) extending between the cooling part 80 and the heating part 90. The drive 83 operates based on operation instructions of the controller 100 to reciprocally move the connecting bracket 82 in one horizontal direction. The drive 83 includes, for example, a driving source such as an electric motor.

The nitrogen atmosphere placement stage 70 is disposed on the cooling plate 81. The nitrogen atmosphere placement stage 70 has approximately the same configuration as the above-described nitrogen atmosphere placement stage 53. The nitrogen atmosphere placement stage 70 includes a cover 701 and a nitrogen supplier 702.

The cover 701 is provided to surround the cooling plate 81, which is a support surface for supporting the wafer W. The cover 701 has a ceiling plate 701a and a sidewall 701b. The ceiling plate 701a is configured in a disk shape with approximately the same diameter as that of the cooling plate 81. The ceiling plate 701a is arranged to face the cooling plate 81 in the vertical direction. The sidewall 701b is configured to extend downward from the outer edge of the ceiling plate 701a. In addition, the cover 701 may have a configuration corresponding to the flow path forming plate 531c of the nitrogen atmosphere placement stage 53 described above.

The nitrogen supplier 702 is provided near the center of the ceiling plate 701a, and is configured to supply nitrogen to a space 703 defined by the cooling plate 81 and the cover 701 (specifically, the ceiling plate 701a and the sidewall 701b). The nitrogen supplier 702 is connected to a nitrogen source (not illustrated), for example, through a supply pipe (not illustrated). By supplying nitrogen to the space 703, the nitrogen supplier 702 enables the cooling of the wafer W by the cooling part 80 in the high nitrogen concentration environment.

Figure 13A:
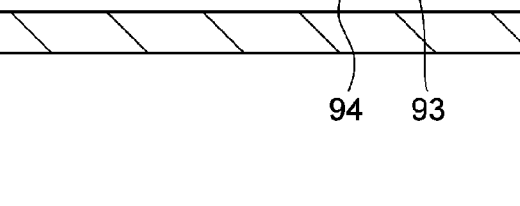
FIG. 13A is a cross-sectional view schematically illustrating an example of a nitrogen atmosphere placement stage with a chamber structure disposed on an independently provided cooling plate.
Figure 13A:
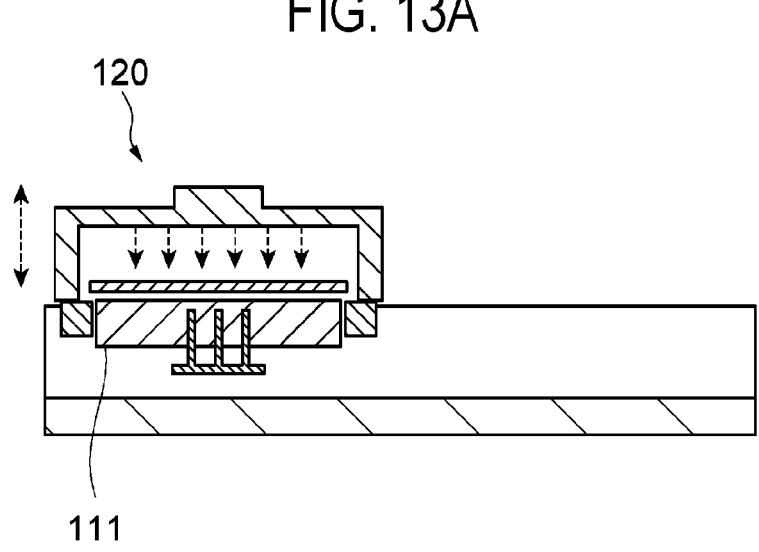
Figure 13B:
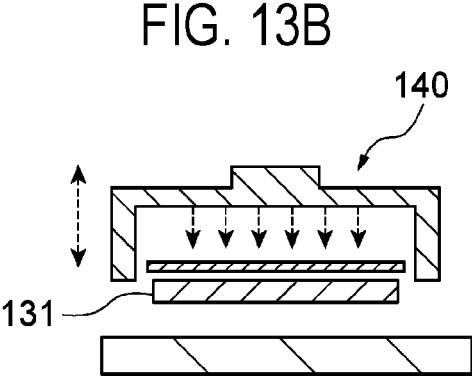
FIG. 13B is a cross-sectional view schematically illustrating another example of a nitrogen atmosphere placement stage with a chamber structure disposed on an independently provided cooling plate.

In addition, the nitrogen atmosphere placement stage with a chamber structure arranged to correspond to the cooling plate is not limited to the above-described nitrogen atmosphere placement stage 70. The nitrogen atmosphere placement stage may be arranged to correspond to, for example, an independently provided cooling plate, in addition to the cooling plate 81 connected to the hot plate 91 as described above. FIG. 13A is a cross-sectional view schematically illustrating an example of a nitrogen atmosphere placement stage with a chamber structure disposed on an independently provided cooling plate 111. FIG. 13B is a cross-sectional view schematically illustrating another example of a nitrogen atmosphere placement stage with a chamber structure disposed on an independently provided cooling plate 131. These cooling plates 111 and 131 may be cooling plates for high-precision cooling considering e.g., temperature distribution in each area of the wafer W, compared to the above-described cooling plate 81.

In the example illustrated in FIG. 13A, a nitrogen atmosphere placement stage 120 with a chamber structure is provided to correspond to the cooling plate 111 provided in the delivery device 104 (see FIG. 2) of the fourth block G4. The cooling plate 111 cools the wafer W by placing the wafer W thereon, for example, in a step following a step using the cooling plate 81 connected to the hot plate 91 described above. The nitrogen atmosphere placement stage 120 has the same configuration as the nitrogen atmosphere placement stage 70.

In the example illustrated in FIG. 13B, a nitrogen atmosphere placement stage 140 with a chamber structure is provided to correspond to the cooling plate 131 provided in the delivery device 103 (see FIG. 2) of the third block G3. In this case, the nitrogen atmosphere placement stage 140 is provided between the second block G2 (processing block) that performs thermal processing, etc., and the cassette station 2, which serves as a loading/unloading part of the wafer W. The cooling plate 131 cools the wafer W by placing the wafer W thereon, for example, in a step following a step using the cooling plate 81 connected to the hot plate 91 described above. The nitrogen atmosphere placement stage 140 has the same configuration as the nitrogen atmosphere placement stage 70.

Figure 14A:
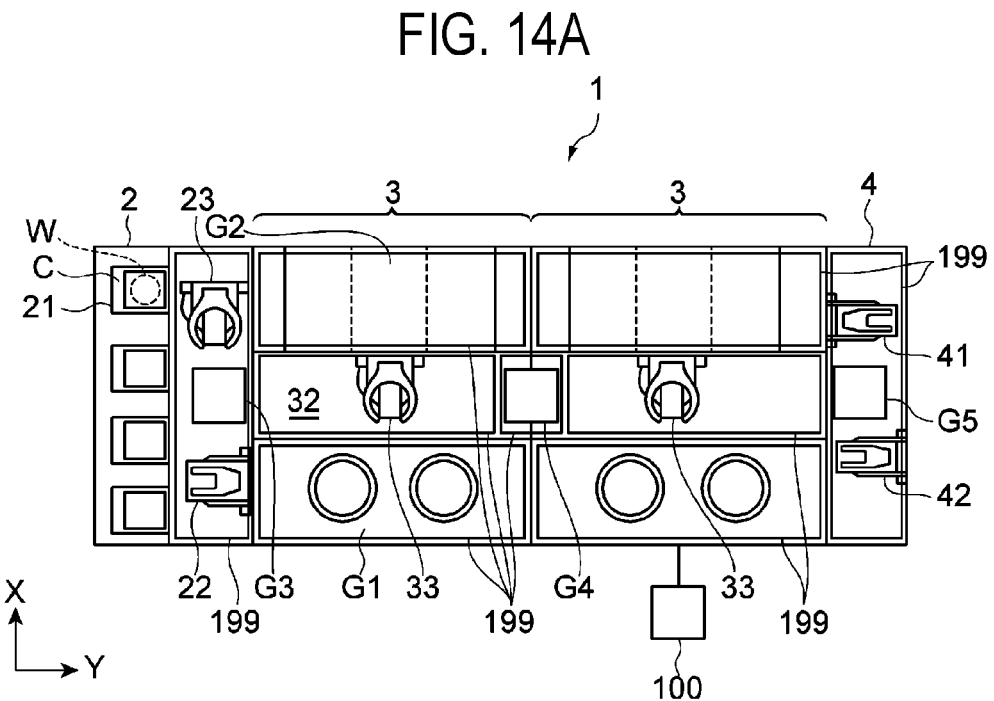
FIGS. 14A and 14B are explanatory diagrams of a downflow generator.
Figure 14B:
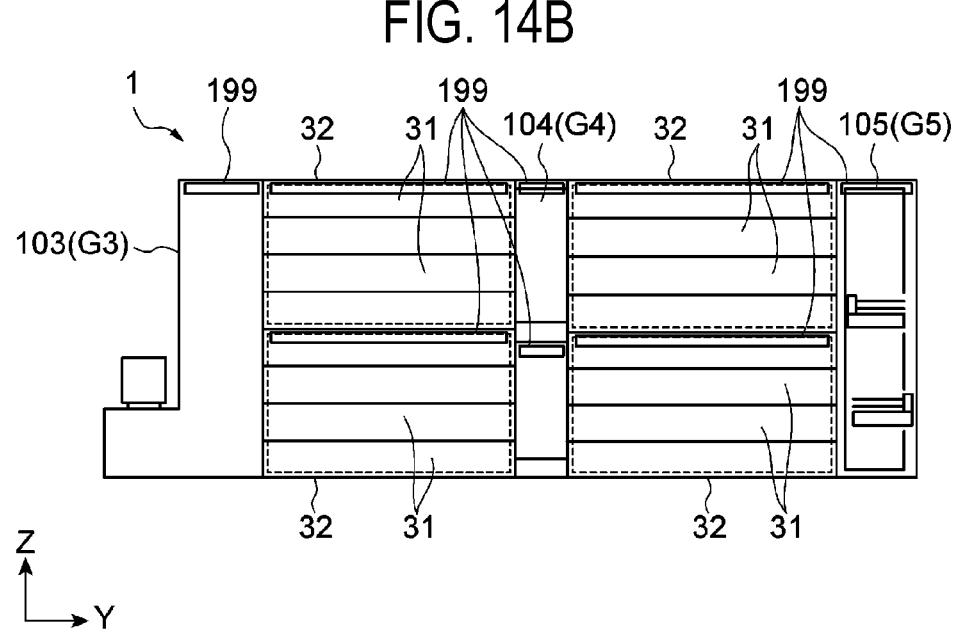

Further, the wafer processing system 1 includes a downflow generator that discharges a gas to generate a downward gas flow (downflow). The gas is supplied toward the downflow generator from a gas source (not illustrated), which is connected to the downflow generator through a gas supply path (not illustrated). For example, the gas source may be provided outside the wafer processing system 1, or may be provided inside the wafer processing system 1. As illustrated in FIGS. 14A and 14B, a downflow generator 199 may be provided, for example, in a space where the wafer transfer devices 22 and 23 and the third block G3 of the cassette station 2 are provided. Alternatively, the downflow generator 199 may be provided at the ceiling of each of the respective layers 31, the wafer transfer area 32, the fourth block G4, and the fifth block G5 of the processing station 3. The gas supplied from the gas source is, for example, air, which may contain gases of various components therein.

The gas supply path, which interconnects the downflow generator and the gas source, is, for example, mainly composed of pipes, ducts, tubes, etc., and a chemical filter (not illustrated) is connected to the middle of the gas supply path. The chemical filter includes, for example, a member with a tiny gap, or a fiber member through which the gas may pass. When the gas supplied from the gas source passes through the chemical filter, the chemical filter captures unwanted gases such as ammonia and/or amine and fine foreign substances, as well as acidic gases and organic gases, thereby removing them from the gas supplied from the gas source. By providing the gas, which is free of these unwanted gases, acidic gases, and organic gases, as a downflow into the space where a substrate exists, there is less possibility that changes occur in the series of MOR film reactions, thereby making it easier to stably form good MOR film patterns.

Operational Effect

Next, the operational effects of the wafer processing system 1 according to the present embodiment will be described.

The wafer processing system 1 includes a first transfer path, which is a transfer path for the wafer W after MOR film formation and before exposure, and a second transfer path, which is a transfer path for the wafer W after exposure. The wafer processing system 1 includes nitrogen atmosphere placement stages (e.g., nitrogen atmosphere placement stages 51, 53, 54, and 70), which are provided on at least one of the first transfer path and the second transfer path and are configured to place the wafer W in the environment with the nitrogen concentration of the atmosphere set higher than that of the air.

In the wafer processing system 1 according to the present embodiment, the nitrogen atmosphere placement stage with the nitrogen concentration set higher than that of the air is provided on at least one of the first transfer path and the second transfer path described above. For example, when the wafer W after MOR film formation (wafer W before and after exposure) is on standby in the normal air environment (air), it is conceivable that the standby time and others cause a variation in CD, making it impossible to obtain good patterns. In this regard, by providing the nitrogen atmosphere placement stage having the nitrogen concentration set higher than that of the air on the transfer path for the wafer W before and after exposure and placing the substrate on standby in the nitrogen atmosphere placement stage, it is possible to prevent a variation in CD. In this way, the wafer processing system 1 according to the present embodiment allows for obtaining good patterns on the wafer W with the MOR film formed thereon.

The wafer processing system 1 includes the delivery device 105, which is provided in the fifth block G5 where the wafer W is delivered to and from the exposure apparatus (see FIG. 2) and which is a tower-shaped device in which a plurality of accommodation spaces are formed vertically at multiple levels as illustrated in FIG. 3A. Further, the wafer processing system 1 includes one or a plurality of air atmosphere placement stages 55 for placing the wafer W in the air environment. Further, the nitrogen atmosphere placement stage 53 is provided in any of the accommodation spaces in the delivery device 105, while the air atmosphere placement stage 55 is provided in any of the accommodation spaces in the delivery device 105, where the nitrogen environment placement stage 53 is not provided.

With this configuration, it is possible to provide the delivery device 105 in the fifth block G5, where the wafer W is delivered to and from the exposure apparatus, with the nitrogen atmosphere placement stage 53 for placing the wafer W in the high nitrogen concentration environment as well as the air atmosphere placement stage 55. Thus, for example, the wafer W with an MOR film formed thereon, which needs to be on standby in the high nitrogen concentration environment, may be allowed to be on standby in the nitrogen atmosphere placement stage 53, and, for example, the wafer W with a CAR film formed thereon, which needs to be on standby in the air environment, may be allowed to be on standby in the air atmosphere placement stage 55. Thus, it is possible to allow the wafer W to be on standby at an appropriate location depending on the type of a formed resist film.

The nitrogen atmosphere placement stage 53 includes the cover 531 provided to surround the cooling plate 521, which is a support surface for supporting the wafer W, and the nitrogen supplier 532 provided on the cover 531 to supply nitrogen into the space 533 defined by the cooling plate 521 and the cover 531. The nitrogen atmosphere placement stage 53 has a chamber structure. With the chamber structure, it is possible to fill the space 533 defined by the cooling plate 521 and the cover 531 with nitrogen, creating an appropriate high nitrogen concentration environment.

The nitrogen atmosphere placement stage 51 includes the plurality of slot dividers 516, which define a plurality of slots where the wafer W is accommodated, and the wall portions 512, 513, and 514 provided on three sides among four sides around the wafer W accommodated in the slot, excluding the opening 517, which serves as an introduction port for the wafer W. Further, the nitrogen atmosphere placement stage 51 has a slot structure including the nitrogen supplier 519 provided on the wall portion 514 facing the opening 517 to supply nitrogen toward the opening 517. With this slot structure, it is possible to efficiently accommodate a plurality of wafers W in respective slots and to supply nitrogen to the space 533 surrounded by the three wall portions 512, 513, and 514 excluding the opening 517, creating an appropriate high nitrogen concentration environment.

The nitrogen atmosphere placement stage 70 is provided in the thermal-processing unit U2 in the second block G2. This allows the wafer W to be on standby in the high nitrogen concentration environment during the standby period in the thermal-processing unit U2.

The nitrogen atmosphere placement stage 140 is provided between the second block G2 and the cassette station 2, which serves as a loading/unloading part of the wafer W. This allows the wafer W to be on standby in the high nitrogen concentration environment, for example, during the standby period before and after the loading and unloading of the wafer W.

The nitrogen concentration in the nitrogen atmosphere placement stage 51 on the first transfer path may be set lower than that in the nitrogen atmosphere placement stage 54 on the second transfer path. Thus, after exposure where a variation in CD is susceptible to the air environment, it is possible to increase the concentration of nitrogen, thereby allowing for creating good patterns on the wafer W with the MOR film formed thereon.

As described above, a substrate processing method according to the present embodiment includes a first step of processing or transferring the wafer W after MOR film formation and before exposure, and a second step of processing or transferring the wafer W after exposure. Further, the substrate processing method includes a third step of causing the wafer W to be on standby in the environment with the nitrogen concentration of the atmosphere set higher than that of the air, the third step being performed together with at least one of the first step and second step.

Although the embodiments of the present disclosure have been described above, the present disclosure is not limited to the above embodiments. For example, although it has been described that nitrogen is supplied by "one or a plurality of nitrogen atmosphere placement stages for placing a substrate in the environment with the nitrogen concentration of the atmosphere set higher than that of the air," gases other than nitrogen may also be supplied. Specifically, air with adjusted ammonia, oxygen, or carbon dioxide which have an effect on the MOR film patterning of the wafer W, acidic gases such as those containing acetic acid, and low humidity air may be supplied.

According to the present disclosure, it is possible to obtain good patterns on a substrate with a MOR film formed thereon.

Finally, various exemplary embodiments included in the present disclosure are described in the following [E1] to [E8].

[E1]

A substrate processing apparatus includes a first transfer path that is a transfer path for a substrate after MOR film formation and before exposure and a second transfer path that is a transfer path for the substrate after exposure. The substrate processing apparatus includes one or a plurality of nitrogen atmosphere placement stages provided on at least one of the first transfer path and the second transfer path and configured to place the substrate in an environment with a nitrogen concentration of an atmosphere set higher than that of air.

[E2]

The substrate processing apparatus of [E1], further includes a tower provided in a block where the substrate is delivered to and from an exposure apparatus and having a plurality of accommodation spaces formed vertically at a plurality of levels, and one or a plurality of air atmosphere placement stages configured to place the substrate in an air environment. The at least one of the nitrogen atmosphere placement stages is provided in any of the accommodation spaces in the tower, and wherein the at least one of the air atmosphere placement stages is provided in any of the accommodation spaces in the tower where the nitrogen atmosphere placement stage is not provided.

[E3]

In the substrate processing apparatus of [E1] or [E2], at least one of the nitrogen atmosphere placement stages has a chamber structure including: a cover provided to surround a support surface supporting the substrate; and a first nitrogen supplier provided on the cover and configured to supply nitrogen into a space defined by the support surface and the cover.

[E4]

In the substrate processing apparatus of [E1] or [E2], the at least one of the nitrogen atmosphere placement stages has a slot structure including a plurality of slot dividers configured to define a plurality of slots where the substrate is accommodated, wall portions provided on three sides among four sides around the substrate accommodated in the slot, excluding an opening that is an introduction port for the substrate, and a second nitrogen supplier formed in an area of the wall portions facing the opening and configured to supply nitrogen toward the opening.

[E5]

In the substrate processing apparatus of [E4], the at least one of the nitrogen atmosphere placement stage has an opening/closing part in the opening. The opening/closing part includes a plurality of shutters provided side by side in a depth direction, each of which has a plurality of passage regions arranged side by side in a vertical direction. Each of the plurality of shutters relatively moves to each other in the vertical direction. By doing this, an area of the opening facing some of the plurality of slots is opened.

[E6]

In the substrate processing apparatus of any one of [E1] to [E5], the at least one of the nitrogen atmosphere placement stages is provided in a thermal-processing unit in a processing block.

[E7]

In the substrate processing apparatus of any one of [E1] to [E5], the at least one of the nitrogen atmosphere placement stages is provided between a processing block and a substrate loading/unloading part.

[E8]

In the substrate processing apparatus of any one of [E1] to [E7], the at least one of the nitrogen atmosphere placement stages is provided on the first transfer path, and the second transfer path. The nitrogen atmosphere placement stage provided on the first transfer path is set to have a lower nitrogen concentration than that in the nitrogen atmosphere placement stage provided on the second transfer path.

[E9]

A substrate processing method includes a first step of processing or transferring a substrate after MOR film formation and before exposure and a second step of processing or transferring the substrate after exposure. Further, the substrate processing method includes a third step of causing the substrate to be on standby in an environment with a nitrogen concentration of an atmosphere set higher than that of air, the third step being performed together with at least one of the first step and the second step.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a first transfer path that is a transfer path for a substrate after MOR film formation and before exposure, and a second transfer path that is a transfer path for the substrate after exposure;
one or a plurality of nitrogen atmosphere placement stages provided on at least one of the first transfer path and the second transfer path and configured to place the substrate in an environment with a nitrogen concentration of an atmosphere set higher than that of air;
a tower provided in a block where the substrate is delivered to and from an exposure apparatus and having a plurality of accommodation spaces formed vertically at a plurality of levels; and
one or a plurality of air atmosphere placement stages configured to place the substrate in an air environment,
wherein at least one of the nitrogen atmosphere placement stages is provided in any of the accommodation spaces in the tower, and
wherein at least one of the air atmosphere placement stages is provided in any of the accommodation spaces in the tower where the nitrogen atmosphere placement stage is not provided.

2. The substrate processing apparatus of claim 1, wherein at least one of the nitrogen atmosphere placement stages is provided on the first transfer path and on the second transfer path, and
wherein the nitrogen atmosphere placement stage provided on the first transfer path is set to have a lower nitrogen concentration than that in the nitrogen atmosphere placement stage provided on the second transfer path.

3. The substrate processing apparatus of claim 1, wherein at least one of the nitrogen atmosphere placement stages has a chamber structure including:
a cover provided to surround a support surface supporting the substrate; and
a first nitrogen supplier provided on the cover and configured to supply nitrogen into a space defined by the support surface and the cover.

4. The substrate processing apparatus of claim 1, wherein at least one of the nitrogen atmosphere placement stages has a slot structure including:
a plurality of slot dividers configured to define a plurality of slots where the substrate is accommodated;
wall portions provided on three sides among four sides around the substrate accommodated in the slot, excluding an opening that is an introduction port for the substrate; and
a second nitrogen supplier formed in an area of the wall portions facing the opening and configured to supply nitrogen toward the opening.

5. The substrate processing apparatus of claim 4, wherein the nitrogen atmosphere placement stage has an opening/closing part in the opening, and
wherein the opening/closing part includes a plurality of shutters provided side by side in a depth direction, each of which has a plurality of passage regions arranged side by side in a vertical direction, wherein when each of the plurality of shutters relatively moves to each other in the vertical direction, an area of the opening facing some of the plurality of slots is opened.

6. A substrate processing apparatus comprising:

a first transfer path that is a transfer path for a substrate after MOR film formation and before exposure, and a second transfer path that is a transfer path for the substrate after exposure; and one or a plurality of nitrogen atmosphere placement stages provided on at least one of the first transfer path and the second transfer path and configured to place the substrate in an environment with a nitrogen concentration of an atmosphere set higher than that of air, wherein at least one of the nitrogen atmosphere placement stages has a slot structure including:

a plurality of slot dividers configured to define a plurality of slots where the substrate is accommodated;

wall portions provided on three sides among four sides around the substrate accommodated in the slot, excluding an opening that is an introduction port for the substrate; and a second nitrogen supplier formed in an area of the wall portions facing the opening and configured to supply nitrogen toward the opening.

7. The substrate processing apparatus of claim 6, further comprising:

a tower provided in a block where the substrate is delivered to and from an exposure apparatus and having a plurality of accommodation spaces formed vertically at a plurality of levels; and one or a plurality of air atmosphere placement stages configured to place the substrate in an air environment, wherein at least one of the nitrogen atmosphere placement stages is provided in any of the accommodation spaces in the tower, and wherein at least one of the air atmosphere placement stages is provided in any of the accommodation spaces in the tower where the nitrogen atmosphere placement stage is not provided.

8. The substrate processing apparatus of claim 7, wherein at least one of the nitrogen atmosphere placement stages is provided on the first transfer path and on the second transfer path, and wherein the nitrogen atmosphere placement stage provided on the first transfer path is set to have a lower nitrogen concentration than that in the nitrogen atmosphere placement stage provided on the second transfer path.

9. The substrate processing apparatus of claim 6, wherein the nitrogen atmosphere placement stage has an opening/closing part in the opening, and wherein the opening/closing part includes a plurality of shutters provided side by side in a depth direction, each of which has a plurality of passage regions arranged side by side in a vertical direction, wherein when each of the plurality of shutters relatively moves to each other in the vertical direction, an area of the opening facing some of the plurality of slots is opened.

10. The substrate processing apparatus of claim 6, wherein at least one of the nitrogen atmosphere placement stages is provided in a thermal-processing unit in a processing block.

11. The substrate processing apparatus of claim 6, wherein at least one of the nitrogen atmosphere placement stages is provided between a processing block and a substrate loading/unloading part.

12. The substrate processing apparatus of claim 6, wherein at least one of the nitrogen atmosphere placement stages is provided on the first transfer path and on the second transfer path, and wherein the nitrogen atmosphere placement stage provided on the first transfer path is set to have a lower nitrogen concentration than that in the nitrogen atmosphere placement stage provided on the second transfer path.

* * * * *